United States Patent
Fine et al.

(10) Patent No.: US 7,181,376 B2
(45) Date of Patent: Feb. 20, 2007

(54) APPARATUS AND METHOD FOR COVERAGE DIRECTED TEST

(75) Inventors: Shai Fine, Raanana (IL); Moshe Levinger, Nofit (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 10/453,150

(22) Filed: Jun. 3, 2003

(65) Prior Publication Data

US 2004/0249618 A1   Dec. 9, 2004

(51) Int. Cl.
*G06F 17/10* (2006.01)
(52) U.S. Cl. .............. 703/2; 703/13; 703/14; 714/25; 714/738; 714/741
(58) Field of Classification Search ........... 703/2, 703/13, 14; 714/25, 738, 741
See application file for complete search history.

(56) References Cited

U.S. PATENT DOCUMENTS

| | | | |
|---|---|---|---|
| 5,922,079 A * | 7/1999 | Booth et al. | 714/26 |
| 6,141,630 A * | 10/2000 | McNamara et al. | 703/14 |
| 6,356,858 B1 * | 3/2002 | Malka et al. | 702/186 |
| 6,675,138 B1 * | 1/2004 | Hollander et al. | 703/13 |
| 6,691,249 B1 * | 2/2004 | Barford et al. | 714/25 |
| 6,968,286 B1 * | 11/2005 | Watkins | 702/124 |
| 2004/0216023 A1 * | 10/2004 | Maoz et al. | 714/742 |

OTHER PUBLICATIONS

Heckerman, "A Tutorial on Learning Bayesian Networks", Technical Report MSR-TR-95-06, Microsoft Corporation, Mar. 1995, pp. 1-40.*

Ziv et al., "Constructing Bayesian-network Models of Software Testing and Maintenance Uncertainties", Proceedings of the 13th IEEE International Conference on Software Maintenance, 1997, pp. 100-109, renumbered as pp. 1-16.*

Bose, Mrinal, et al., "A Genetic Approach to Automatic Bias Generation for Biased Random Instruction Generation," 0-7803-6657-3/01 © 2001 IEEE, pp. 442-448.

Tasiran, Serdar, et al., "A Functional Validation Technique: Biased-Random Simulation Guided by Observability-Based Coverage," 0-7695-1200-3/01 © 2001 IEEE, pp. 82-88.

Nativ, Gilly, et al., "Cost Evaluation of Coverage Directed Test Generation for the IBM Mainframe," IBM Corporation, pp. 1-10.

Ur, Shmuel, et al., "Micro Architecture Coverage Directed Generation of Test Programs," DAC 99, New Orleans, Louisiana (c) 1999 ACM 1-58113-109-7/99/06.

* cited by examiner

Primary Examiner—Kamini Shah
Assistant Examiner—Herng-der Day
(74) Attorney, Agent, or Firm—Stephen C Kaufman

(57) ABSTRACT

A Bayesian network correlating coverage data and input data to a test verification system for coverage directed test generation (CDG) of a device under test. In one embodiment, the Bayesian network is part of a CDG engine which also includes a data analyzer which analyzes coverage data from a current test run of a test verification system and from previous test runs to determine which coverage events from a coverage model have occurred therein, at what frequency and which ones have not yet occurred, a coverage model listing coverage events which define the goal of the test verification system and a task manager coupled to the data analyzer and the Bayesian network which refers to the coverage model and queries the Bayesian network to produce input data to achieve desired coverage events.

13 Claims, 8 Drawing Sheets

APPARATUS AND METHOD FOR COVERAGE DIRECTED TEST

FIELD OF THE INVENTION

The present invention relates generally to simulation based functional verification of devices under test and to such verification using coverage directed test generation in particular.

BACKGROUND OF THE INVENTION

Functional verification is widely acknowledged as the bottleneck in the hardware design cycle. In current industry practice, verification by simulation, or dynamic verification, is the leading technique for functional verification. Coverage is used to ensure that the verification of the design is thorough, and the definition of "coverage events" or testing requirements is a major part in the definition of the verification plan of the design. Often, a family of coverage events that share common properties are grouped together to form a "coverage model". Members of the coverage model are called "coverage tasks" and are considered part of the coverage model. These models are defined by a basic event and a set of parameters or attributes, where the list of coverage tasks comprises all permissible combinations of values for the attributes.

Reference is now made to FIG. 1, which illustrates the verification process with an automatic random test generator 10. A coverage model 12 is translated by a verification team 14 to a set of directives 16 for the random test generator 10. Based on these directives 16 and embedded domain knowledge, test generator 10 produces many test-cases 18. A simulator 20 then simulates a design under test (DUT) 22 using generated test-cases 18 and the behavior of DUT 22 is monitored using checking (e.g. "assertion") tools and other checking methods, such as final results comparisons, to make sure that it meets its specification. In addition, coverage tools 24 are used to review the coverage information 25 produced by simulator 20 and to detect the occurrence of coverage tasks during simulation. Analysis of reports 26 allows verification team 14 to modify directives 16 to test generator 10 to overcome weaknesses in the implementation of coverage model 12. This process is repeated until the exit criteria in coverage model 12 are met.

The use of automatic test generators can dramatically reduce the amount of manual labor required to implement coverage model 12. Even so, the manual work needed for analyzing the coverage reports and translating them to directives 16 for test generator 10 can constitute a bottleneck in the verification process. Therefore, considerable effort has been spent on finding ways to automate this procedure. One automated feedback process from coverage analysis to test generation is known as coverage directed test generation (CDG).

In general, the goal of CDG is to automatically provide directives that are based on coverage analysis to the test generator. This can be further divided into two sub-goals: First, to provide directives to the test generator that help in reaching hard cases, namely uncovered or rarely covered tasks. Achieving this sub-goal can shorten the time needed to fulfill the coverage model and can reduce the number of manually written directives. Second, to provide directives that allow easier reach for any coverage task, using a different set of directives when possible. Achieving this sub-goal makes the verification process more robust, because it increases the number of times a task has been covered during verification. Moreover, if a coverage task is reached via different trajectories, the chances of discovering hidden bugs related to this task are increased.

In the past, two general approaches for CDG have been proposed: feedback-based CDG and CDG by construction. Feedback-based CDG relies on feedback from the coverage analysis to automatically modify the directives to the test generator. For example, in the article, by M. Bose et al., entitled "A genetic approach to automatic bias generation for biased random instruction generation," published in Proceedings of the 2001 Congress on Evolutionary Computation CEC2001, pages 442–448, May 2001, a genetic algorithm is used to select and modify test-cases to increase coverage. In the article by S. Tasiran, et al. entitled, "A functional validation technique: biased random simulation guided by observability-based coverage", published in *Proceedings of the* 2001 *International Conference on Computer Design*, pages 82–88, September 2001, coverage analysis data is used to modify the parameters of a Markov Chain that represents the DUT. The Markov Chain is then used to generate test-cases for the design. In the article by G. Nativ et al. entitled "Cost evaluation of coverage directed test generation for the IBM mainframe," published in *Proceedings of the* 2001 *International Test Conference*, pages 793–802, October 2001, the coverage analysis results trigger a set of generation rules that modify the testing directives. In contrast, in CDG by construction, an external model of the DUT is used to generate test directives designed to accurately hit the coverage tasks. For example, in the article by S. Ur and Y. Yadin entitled "Micro-architecture coverage directed generation of test programs," published in *Proceedings of the* 36th *Design Automation Conference*, pages 175–180, June 1999, an FSM model of pipelines is used to generate tests that cover instruction interdependencies in the pipes.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
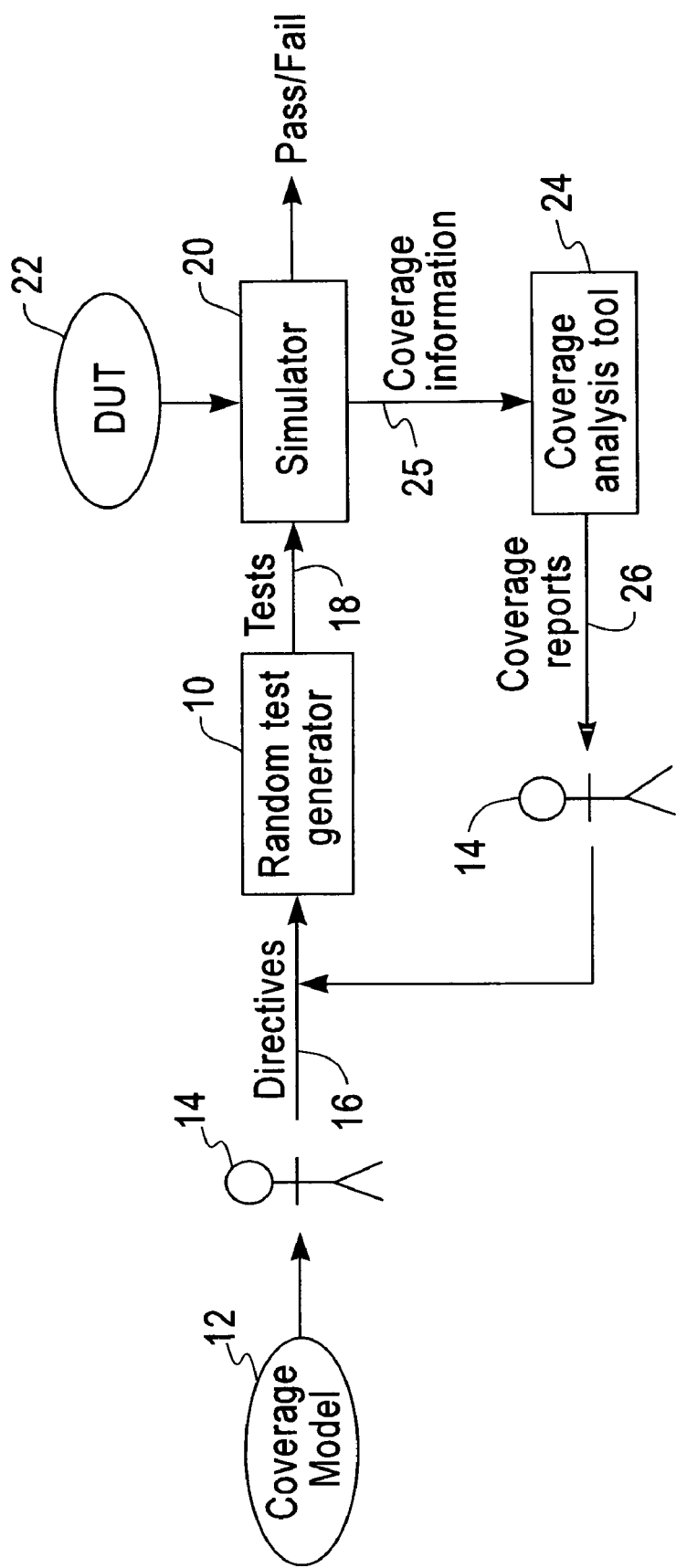
FIG. 1 is a block diagram illustration of a prior art test verification system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2:
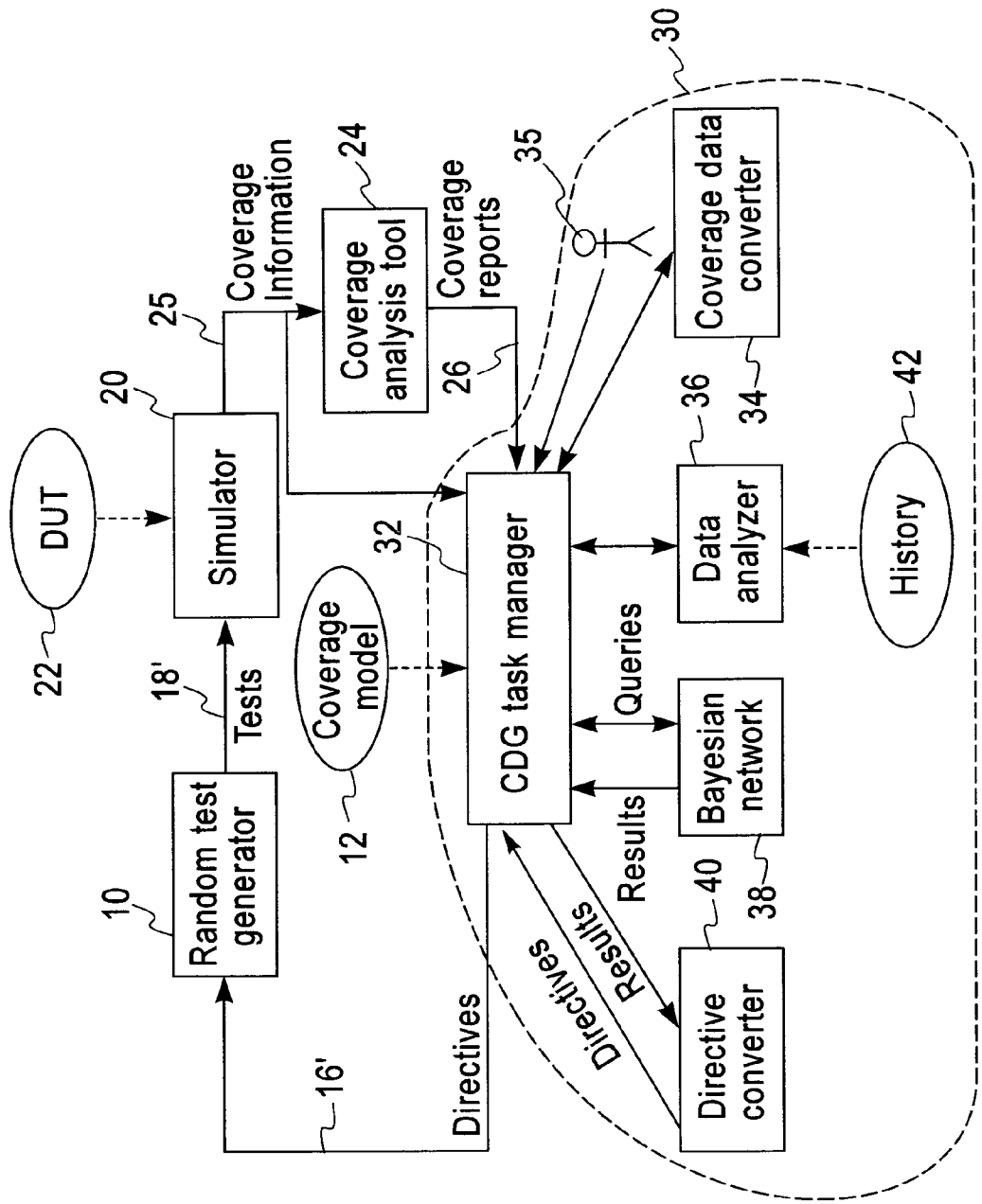
FIG. 2 is a block diagram illustration of a coverage directed test generation (CDG) test verification system having a CDG engine, constructed and operative in accordance with a preferred embodiment of the present invention.

Reference is now made to FIG. 2, which illustrates a coverage directed test generation (CDG) engine 30, constructed and operative in accordance with an embodiment of the present invention. The test verification system may be similar to that shown in FIG. 1, and thus, similar items have similar reference numerals. In an alternative embodiment, discussed in detail with respect to FIG. 9, the test verification system is different than that of FIG. 1.

In FIG. 2, the feedback loop from the output of simulator 20 to directives, here labeled 16', may be provided by CDG engine 30, rather than by verification team 14. Specifically, CDG engine 30 may produce directives 16' to random test generator 10 based on either or both of coverage information 25 from simulator 20 and coverage reports 26 produced by coverage analysis tool 24. Test generator 10 may produce new tests 18' which will be used by simulator 20 to stimulate and/or operate design under test 22. The simulation output of simulator 20 may be analyzed by coverage analysis tool 24 and the output may be provided to CDG engine 30.

In accordance with a preferred embodiment of the present invention, CDG engine 30 may comprise a CDG task manager 32, a coverage data converter 34, a data analyzer 36, a Bayesian network 38 and a directive converter 40. CDG task manager 32 may utilize coverage model 12 to define its goals, may receive coverage information 25 and coverage reports 26 as input and may query Bayesian network 38 to determine possible directives 16' to send to test generator 10 to create a new set of tests 18' which may, in the next simulation, achieve at least some of the goals of coverage model 12.

CDG task manager 32 may activate coverage data converter 34 to convert coverage data (either or both of coverage information 25 and coverage reports 26) to a form that Bayesian network 38 can utilize (such as a numerical format) and may activate directive converter 40 to convert the output of Bayesian network 38 into new directives 16'. CDG task manager 32 may activate data analyzer 36 to analyze both coverage data and a history 42 of coverage data to determine what coverage events have not yet been seen or what events have occurred too frequently or too infrequently. The latter is utilized to balance the occurrence of events in test runs.

CDG engine 30 may also receive instructions from a member 35 of the verification team as to desired coverage tasks and possible constraints on directives for a particular set of tests or for all tests.

The present application first discusses Bayesian networks in general, then discusses how Bayesian network 38 is implemented for CDG engine 30. Afterwards, the present application provides two examples of CDG engine 30. Finally, the application describes other test verification systems or portions thereof with which CDG engine 30 may operate.

A Brief Introduction to Bayesian Networks

Bayesian networks provide a generally compact representation of the complex (possibly stochastic) relationships among the CDG ingredients, together with the possibility to encode essential domain knowledge. Bayesian network 38 may model the CDG process itself, namely the trial-and-error procedure performed by verification team 14, which controls the test generation at one end and traces the progress of covering coverage model 12.

Bayesian networks are known in the art; some commercially available ones include Hugin Expert, downloadable from www.hugin.com, and Bayes Net toolbox for Matlab, downloadable from www.ai.mit.edu.

Figure 3:
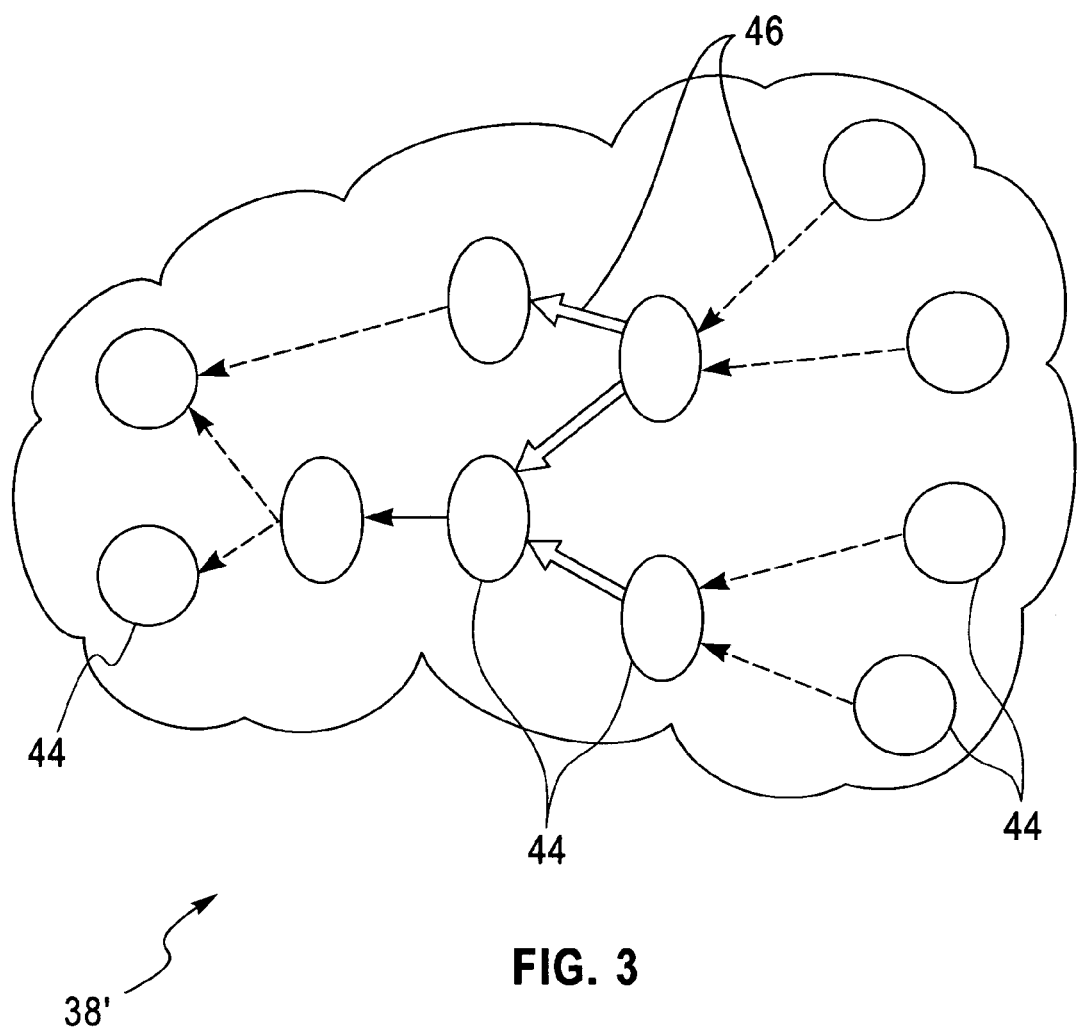
FIG. 3 is a schematic illustration of a Bayesian network forming part of the CDG engine of FIG. 2.

A Bayesian network is a graphical representation of the joint probability distribution for a set of variables. An exemplary network 38' is shown in FIG. 3 to which reference is now made. Bayesian network 38' is formed of a directed acyclic graph having nodes 44 and edges 46 which connect nodes 44 together. Each node 44 corresponds to a random variable and nodes are only connected to other nodes if they are probabilistically dependent on each other in some way. Each node 44 also comprises a collection of local interaction models that describe the conditional probability $p(X_i|Pa_i)$ of the variable $X_i$ at the node given its parents $Pa_i$. The Bayesian network 38' represents a unique joint probability distribution over the complete set of variables $X_i$. The joint distribution is given by the following equation:

$$P(X) = \prod_{i=1}^{n} p(X_i | Pa_i) \qquad \text{Equation 1}$$

Equation 1 shows that the joint distribution specified by a Bayesian network has a factored representation as the product of individual local interaction models.

Typical types of queries that can be efficiently answered by the Bayesian network model are derived from applying the Bayes rule to yield posterior probabilities for the values of a node (or set of nodes) X, given some evidence, E, i.e. assignment of specific values to other nodes:

$$p(X|E) = \frac{p(E|X) * p(X)}{p(E)} \qquad \text{Equation 2}$$

Thus, a statistical inference can be made in the form of either selecting the maximal a posteriori (MAP) probability, max $p(X|E)$, or obtaining the most probable explanation (MPE), arg max $p(X|E)$.

The methods that have been developed for using Bayesian networks provide the means for predictive and diagnostic inference. A "diagnostic query" is such that the evidence nodes E represent a cause, while the queried nodes X represent an effect. The reversed direction, i.e. evidence on the effect nodes which serves to determine the possible cause, is called "abductive". These methods also allow Bayesian networks to reason efficiently with missing values, by computing the marginal probability of the query given the observed values.

There are two important extensions of Bayesian networks: Dynamic Bayesian networks and influence diagrams. The first extension (see the article by Z. Ghahramani entitled "Learning dynamic Bayesian networks," in the book *Adaptive Processing of Sequences and Data Structures*, Lecture Notes in Artificial Intelligence, pages 168–197, published by Springer-Verlag, 1998). enables the incorporation of time, thus modeling temporal dependencies in a stochastic process. The second extension (see the book by R. G. Cowell, et al., entitled *Probabilistic Networks and Expert Systems*, published by Springer-Verlag, 1999) enriches the Bayesian network paradigm with decision making and utility considerations.

A Bayesian Network for CDG

Figure 4:
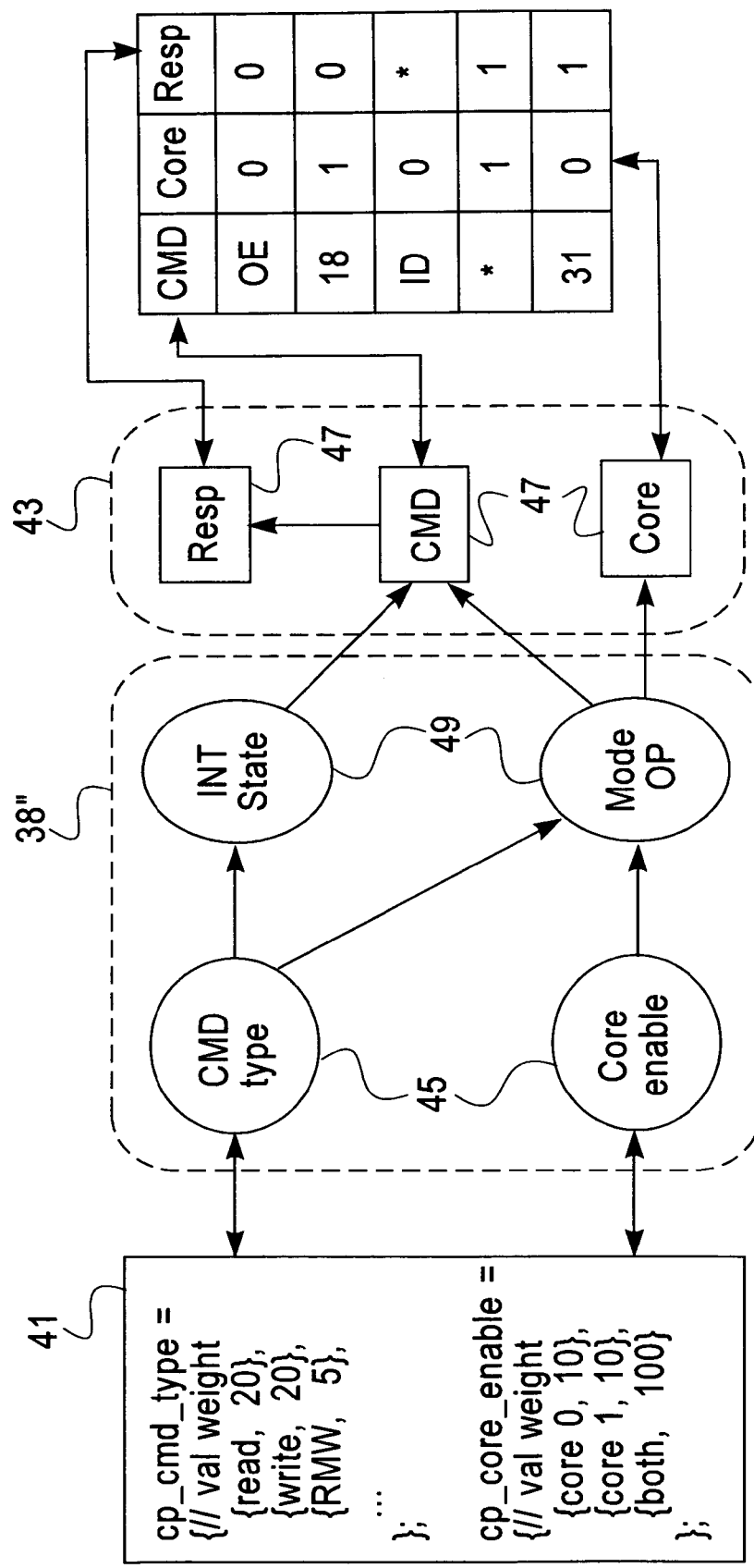
FIG. 4 is a schematic illustration of an exemplary Bayesian network.

As described hereinabove, the present invention may utilize Bayesian network 38 to form part of CDG engine 30. Reference is now made to FIG. 4, which illustrates a simple Bayesian network 38". Bayesian network 38" may describe the relationship between directives, labeled 41, and coverage variables 43. In FIG. 4, coverage variables 43 may include CORE, CMD and RESP, where CORE indicates which core of a central processing unit (CPU) generated a command CMD and RESP indicates the response from implementing command CMD. Directives 41 of FIG. 4 may include cp_core_enable and cp_cmd_type. cp_core_enable may list which cores to enable and how often and cp_cmd_type may list which types of commands (read, write, etc) to be generated by the cores and how many times.

The verification team 35 may choose whether to design the Bayesian network from directives 41 to coverage variables 43 (i.e. in the feed-forward direction) or vice versa (i.e. in the feedback direction). Typically, one of the two directions produces a simpler network. Bayesian network 38" of FIG. 4 operates in the feed-forward direction. Thus, it may have directive nodes 45 that relate to directives 41 and coverage nodes 47 that define the coverage space. In addition to these nodes, for which there may be physical observations, the network may also contain "hidden" nodes 49, namely random variables for which there may not be any physical evidence (observations) for their interactions. Hidden nodes may be included in a Bayesian network structure primarily to reflect expert domain knowledge regarding hidden causes and functionalities which impose some structure on the interaction among the interface (observed) nodes. Introducing hidden nodes to the network structure may reduce the computational complexity of Bayesian network 38" by reducing its dimensionality, and may also help to capture non-trivial (higher order) correlations between observed events.

Bayesian network 38" may describe the causal relationships from the directives 41 (causes) to the coverage variables 43 (effects). Note the absence of a direct link between the requested core (via the directive cp_core_enable) and the observed one (coverage variable CORE) which captures the verification team's understanding that there is no direct influence between directives 41 and the resulting coverage variables 43. A bidden node MODE OP may be included in Bayesian network 38" which may implement the choice of the resulting CMD and CORE. Another assumption encoded in Bayesian network 38" is that the only information that governs the response to a command CMD is the command itself, and this is encoded via a direct link from CMD to RESP.

A designer of CDG Bayesian network 38 may start by identifying the ingredients (attributes) of directives 16' and of the coverage model 12. These attributes are dictated by the interface to random test generator 10 (FIG. 2) (e.g. directives 16'), to coverage analysis tool 24, and by the specification of coverage model 12. These ingredients may be used to define a first set of nodes in the graph. A designer may then utilize knowledge of DUT 22 to connect these nodes to other nodes with edges. A good practice in specifying network 38 may be to connect only those nodes which the designer believes are directly influencing one another. Hidden nodes may then be added to the structure, either to represent hidden causes or to reduce complexity (see the article by G. Elidan, et al. entitled "Discovering hidden variables: A structure-based approach," published in *Proceedings of the 13th Annual Conference on Neural Information Processing Systems*, pages 479–485, 2000).

After the Bayesian network structure is specified, CDG engine 30 may train it using a sample of directives and the associated coverage tasks. For training, one of the many known learning algorithms (cf. the book by R. G. Cowell, et al.) may be used to estimate the Bayesian network's parameters (i.e. the set of conditional probability distributions). This completes the design and training of Bayesian network 38.

In the evaluation phase, CDG engine 30 may utilize the trained Bayesian network to determine directives for a desired coverage task. For example, CDG task manager 32 (FIG. 2) may utilize posterior probabilities and MAP and MPE queries and may utilize the coverage task attributes as evidence. For example, in a model for which the directives are weights of possible outcomes for internal draws in the test generator (e.g. the directive cp_cmd_type in FIG. 4 specifies a preference to read and write commands), a designer may specify a desired coverage task assignment for the coverage nodes (e.g. Resp=ACK) and CDG task manager 32 may have Bayesian network 38' calculate the posterior probability distribution for directive nodes (e.g. p(Cmd Type|Resp=ACK)). CDG task manager 32 may then have directive converter 40 translate the results into a set of weights to be written in the directives 41. Note, as the example demonstrates, partial evidence and/or a partial set of directives may be specified.

The following describes two example devices under test (DUTs) 22 and the Bayesian networks 32 used to implement their CDG engines.

Instruction Stream Generation Using a Dynamic Network

Figure 5:
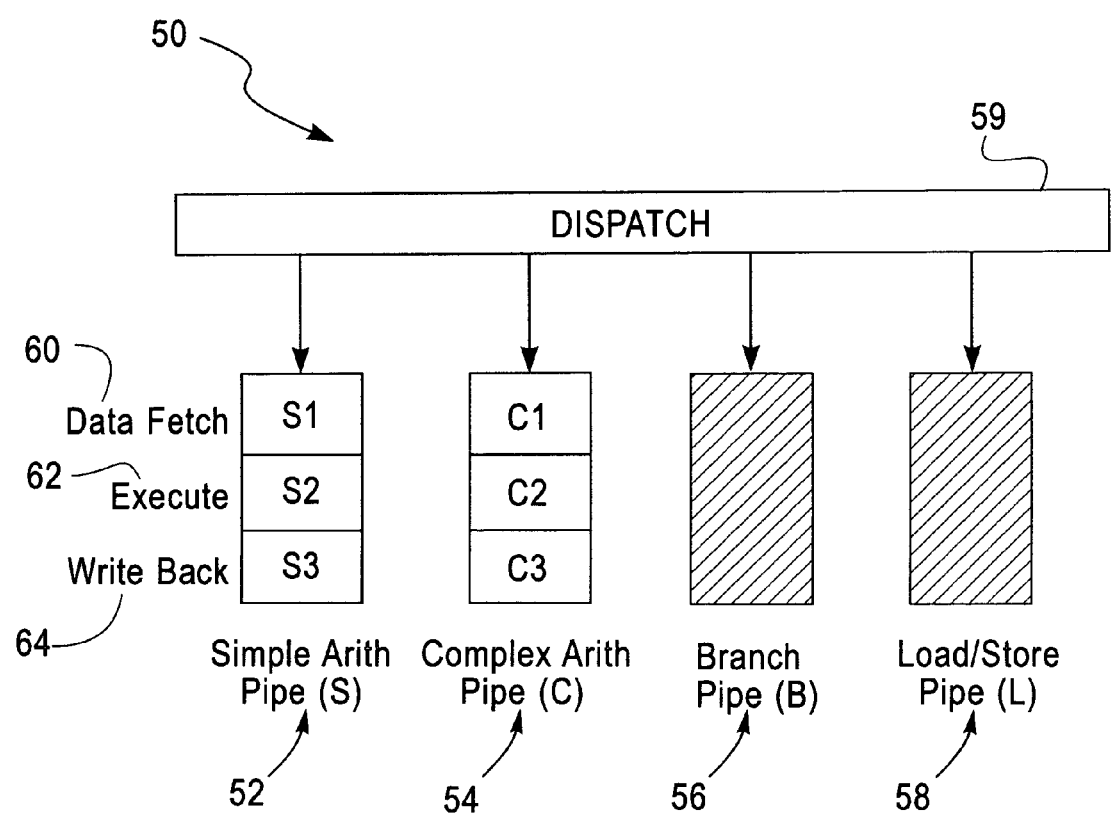
FIG. 5 is a schematic illustration of a first exemplary device under test, which device is a part of a pipeline of a processor.

The first experiment modeled a subset 50 of the pipelines of NorthStar, an advanced PowerPC processor, commercially available from International Business Machines (IBM) Inc. Subset 50 is shown in FIG. 5, to which reference is now made, and comprises four execution units 52, 54, 56 and 58 and a dispatch unit 59 that dispatches instructions to execution units 52–58. Each execution unit comprises three pipeline stages: a data fetch stage 60, during which the data of the instruction may be fetched; an execute stage 62, during which the instruction may be executed; and a write back stage 64, during which the result may be written back to the target register.

For the experiment, each instruction was modeled by four input variables. The first variable indicated the type of the instruction. There were five possible types: S—simple arithmetic; C1, C2, C3—complex arithmetic; and NOP—instructions that are executed in other execution units. The second and third input variables were the source and target registers of the instructions. The experiment utilized only eight registers instead of the 32 registers available in the PowerPC. The last input variable indicated whether the instruction uses the condition register. Due to restrictions on the legal combinations of the input variables, there were 449 possible instructions.

The coverage model 12 for the experiment examined the state of the simple and complex arithmetic pipelines 52 and 54, and the properties of the instructions in them. The coverage model 12 consisted of five attributes: the type of instruction at data fetch stage 60 of pipelines 52 and 54 (S1Type and C1Type, respectively), flags indicating whether execute stages 62 were occupied (S2Valid and C2Valid, respectively), and a flag indicating whether the instruction at execute stage 62 of the simple arithmetic pipeline uses the condition register (S2CR). The total number of legal coverage tasks in the model was 54 (out of 80 possible cases).

The goal of the experiment was to generate instruction streams that cover the coverage model described above. Specifically, the experiment concentrated on the ability to reach the desired coverage cases with many relatively short instruction sequences.

Figure 6:
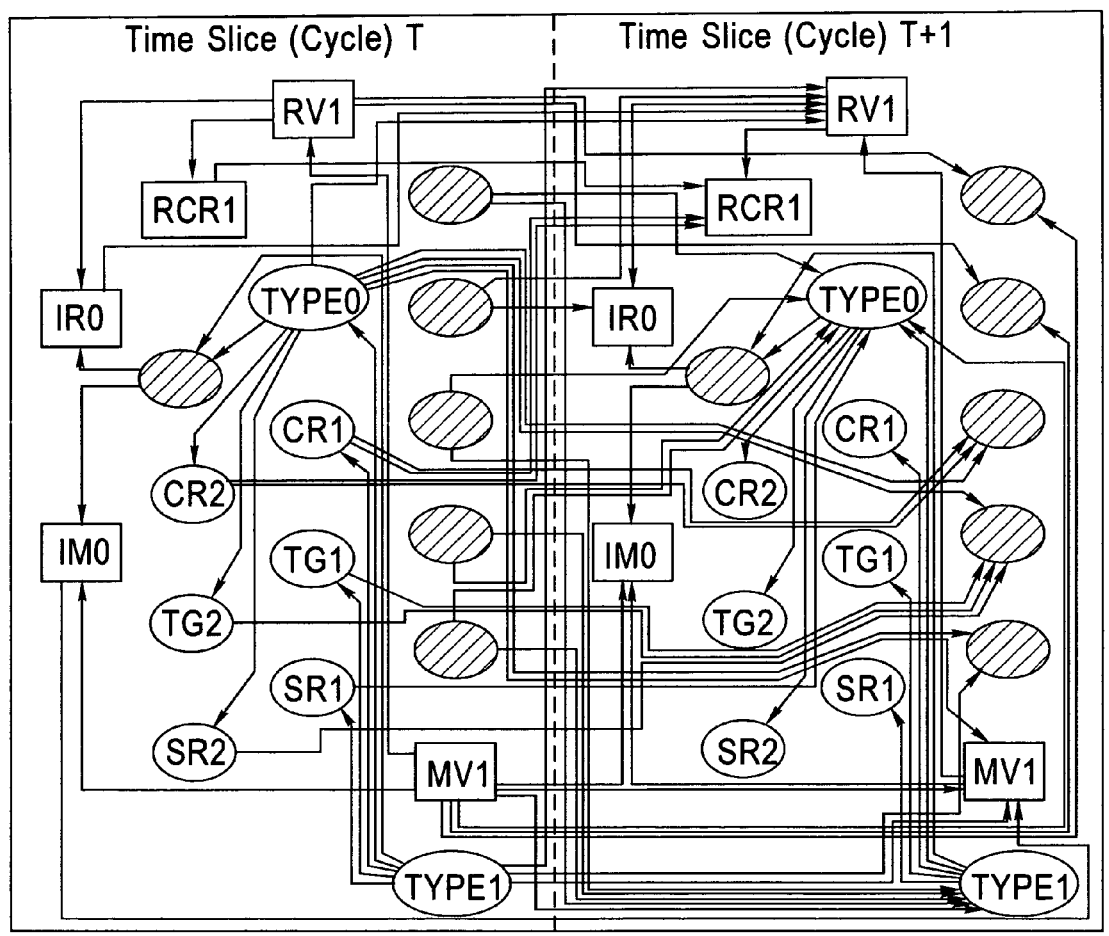
FIG. 6 is a schematic illustration of a Bayesian network for the device of FIG. 5.

The Bayesian network, labeled 70, for this experiment is shown in FIG. 6, to which reference is now made. Bayesian network 70 is a two-slice Dynamic Bayesian Network (DBN), as described in the article by Ghahramani mentioned hereinabove, which modeled the temporal dependencies between the instructions and the coverage tasks, and among the instructions. The DBN also encoded the general knowledge of an expert on the modus operandi of this type of DUT 22. The resulting DBN 70 has 19 nodes per time slice t, 5 are coverage nodes (indicated by squares), 8 are directive nodes (indicated by white ovals) and 6 are hidden nodes (indicated by shaded nodes). DBN 70 also has 15 intra (within a slice) edges and 37 inter (between slice) edges.

The training set included 1000 sequences of random instructions, of 10 cycles each. The training set contained 385 randomly chosen different instructions out of 449 possible instructions. During its simulation, 49 (out of 54) coverage cases were observed. The average number of instructions per sequence in the training set was 9.7 out of the 20 possible dispatches in 10 cycles (i.e., more than half of the dispatch slots in the sequence are empty). This is due to "stall states", states where there are collisions between dispatches. Since the instructions are randomly produced, some instructions may counter other instructions. For example, two pipelines may be trying to write to the same register. Since this is not allowed, one of the pipelines has to wait for the other to finish its job.

After training DBN 70, CDG task manager 32 attempted to generate instruction sequences for all 54 coverage tasks in the coverage model. Each sequence was generated by DBN 70 by solving the Most Probable Explanation (MPE) problem for the coverage task requested by CDG task manager 32. All 49 coverage cases of the training set plus three additional uncovered cases were reached using instruction sequences designed by DBN 70. In addition, CDG task manager 32 requested that DBN 70 generate many different instruction sequences for each coverage task. The average number of cycles in a generated sequence dropped to 2.9, while the average number of instructions in a sequence dropped to 3.7. This reflects the fact that the generated instruction sequences caused less stall states en-route to reaching the desired coverage cases. Table 1 illustrates the details of reaching two difficult coverage cases—the rarest coverage task, which was seen only once in the training set, and an uncovered task.

TABLE 1

|  | Rare | | Uncovered | |
| --- | --- | --- | --- | --- |
|  | Instructions | Cycles | Instructions | Cycles |
| Training Set | 6 | 7 | — | — |
| DBN 70 | 4 | 5 | 4 | 5 |
| Text Book | 3 | 4 | 3 | 4 |

Table 1 shows the number of cycles and instructions required to reach the rare and uncovered tasks in the training set, by the trained DBN 70, and using an optimal solution generated by considering the logic of the simple circuit. Table 1 indicates that the instruction sequences generated by DBN 70 were shorter, both in instructions and cycles, than the sequences in the training set. Overall, the results indicate that DBN 70 was able to generate many compact instruction sequences that were not far from the best possible solutions.

Storage Control Experiment Using a Static Network

Figure 7:
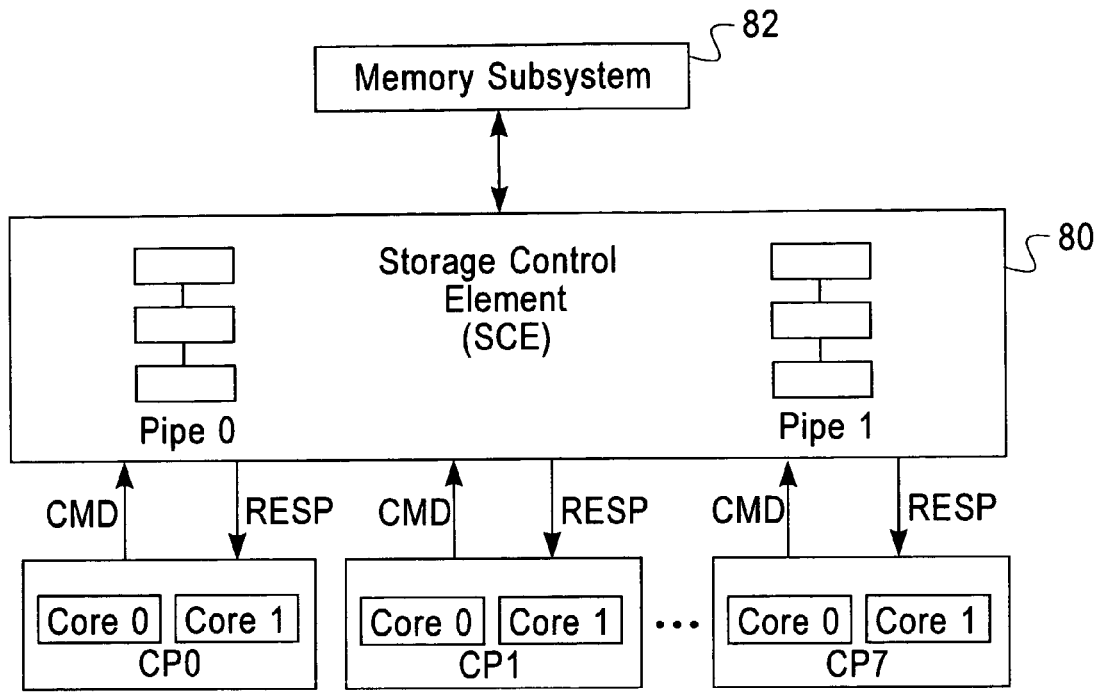
FIG. 7 is a schematic illustration of a second exemplary device under test, which device is a storage control element.

The design under test 22 for the second experiment is the Storage Control Element (SCE) 80 of an IBM z-series system, shown in FIG. 7, to which reference is now made. SCE 80 may handle commands from eight CPUs (CP0–CP7). Each CPU consists of two cores, Core0 and Core1, respectively, which may independently generate commands to SCE 80. SCE 80 may handle incoming commands using two internal pipelines, Pipe0 and Pipe1. When SCE 80 finishes handling a command, it may send a response to the commanding CPU.

The simulation environment in this experiment also comprised behavioral models for the eight CPUs that SCE 80 services and a behavioral model for a memory subsystem 82. The behavioral models of the CPUs generated commands to SCE 80 based on their internal state and a directive file provided by a member of verification team 35. The directive file contained a set of directives that affect the behavior of the system of FIG. 7. Some of these directives controlled the entire system while others are specific to certain components of the system, such as a specific CPU. FIG. 4 is an example of some directives that were used in the simulation environment of the SCE. Each directive contained a set of possible values that the directive may receive. Each value had a weight associated with it. When the value of a directive was needed, test generator 10 randomly chose the value from the set of possible values according to the weights of these values. For example, when a CPU generated a new command, test generator 10 first used the cp_cmd_type directive to determine the type of command to generate, and then randomly chose a specific parameter for that command type to determine the exact command to be used.

CDG task manager 32 attempted to cover all the possible transactions between the CPUs and SCE 80. The coverage model contained five attributes: The CPU (8 possible values) and the core (2 values) in it that initiated the command, the command itself (31 values), its response (14 values), and the pipeline in SCE 80 that handled it (2 values). Overall, there were 13,888 cases and the coverage model contains 1968 legal coverage tasks.

For the test parameters, only the distribution of each parameter could be specified and observed. Moreover, in some cases the behavioral models ignored the directives and generated commands based on an internal state. Thus, the actual distribution used was not exactly the provided distribution of the directives. This type of observation (distribution instead of specific value) is known as "soft evidence". The coverage data from simulator 20 was a summary of all the coverage tasks that occurred during the simulation of a test-case. Therefore, it was hard to correlate between the observed coverage tasks and the directive's values that caused them and between the different observed coverage tasks.

A first experimental Bayesian network contained edges between each of the coverage variables and each of the test parameters. This network was trained with 160 test-cases and the analysis of the trained network showed that most of the directives were strongly correlated either to the command and response coverage variables or to the pipe and core variables, but only a single variable was strongly correlated to all coverage variables. Therefore, a second experimental Bayesian network was partitioned into two networks, one for command and response and the other for core and pipe. The result of the inference on the common parameter from the first network was used as input for the second one. The second network was trained with the same training set of 160 test-cases. During the training, 1745 out of the 1968 tasks in the model were covered, while 223 remained uncovered.

Figure 8:
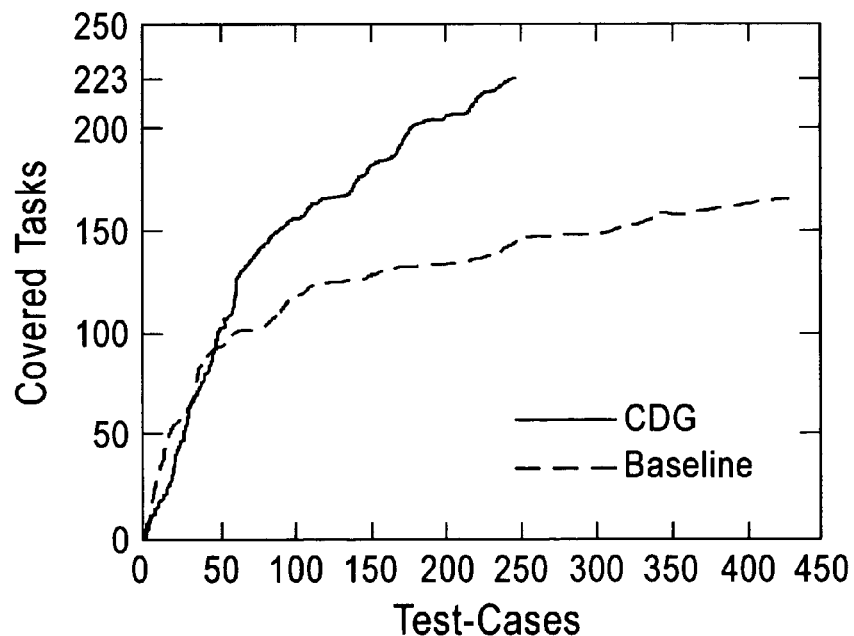
FIG. 8 is a graphical illustration of coverage progress using a CDG engine of the present invention for the device of FIG. 7.

In the experiment, CDG task manager 32 generated a large number of test directive files, aimed at specific sets of uncovered tasks. CDG task manager 32 randomly partitioned the uncovered tasks and used trained Bayesian network to create a directive file for each partition. Simulator 20 then simulated a single test-case for each directive file. This process was repeated until all the tasks were covered. FIG. 8 shows the coverage progress for the second use scenario compared to a directive file prepared by an expert user. CDG engine 30 was able to cover all uncovered tasks after 250 test-cases, while the baseline case of the expert user covered only two thirds of them after over 400 test-cases.

It will be appreciated that the two examples provided here are merely example implementations for specific devices under test. Every device under test will have its own Bayesian network; however, the present invention incorporates all uses of Bayesian networks in the CDG process.

Figure 9:
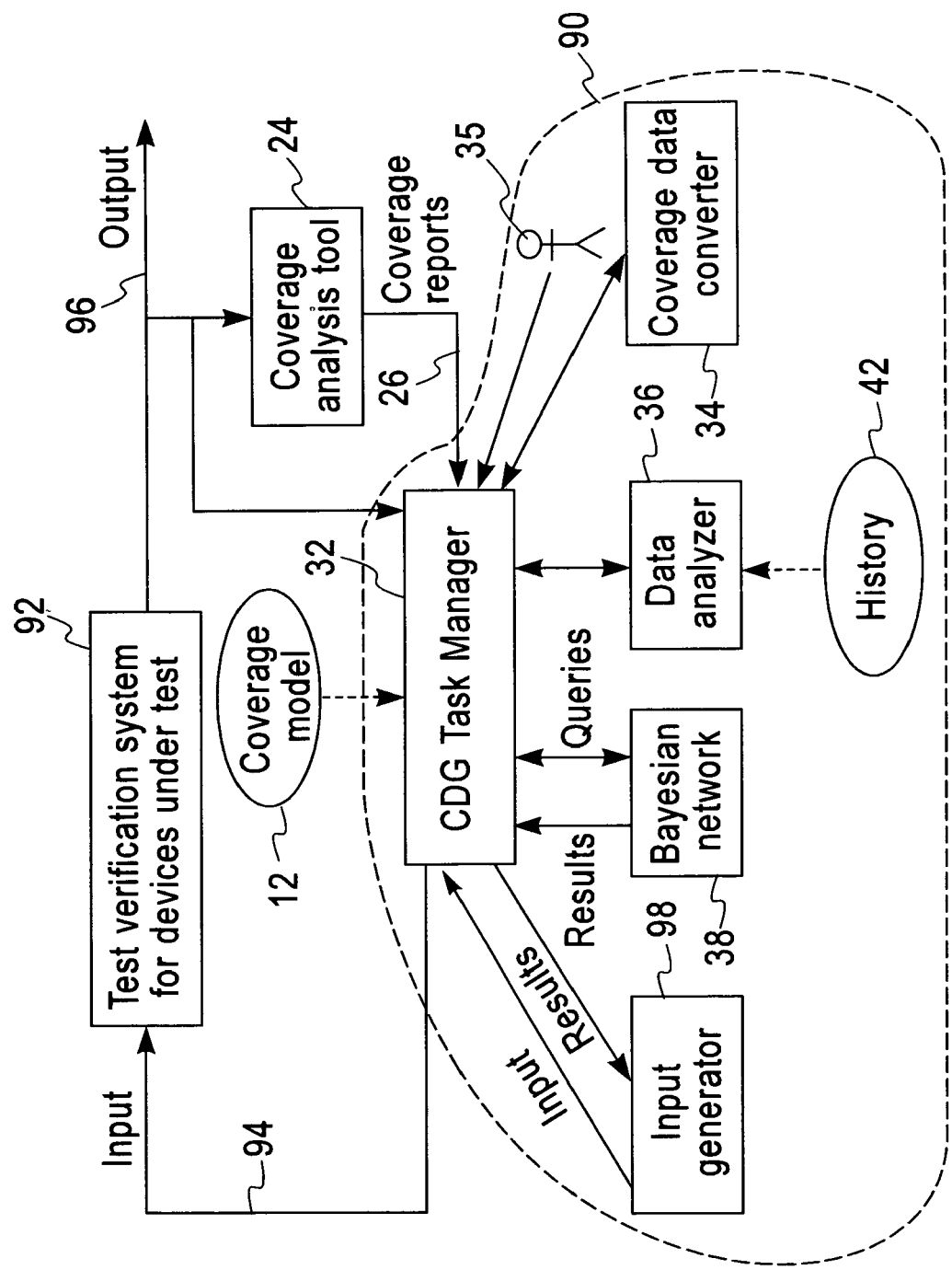
FIG. 9 is a block diagram illustration of an alternative CDG test verification system and CDG engine, constructed and operative in accordance with a second preferred embodiment of the present invention.

Reference is now made to FIG. 9, which illustrates an alternative embodiment of CDG engine, here labeled 90, operative with other test verification systems. CDG engine 90 may operate with any test verification system 92 which has inputs 94 and outputs 96 and a coverage analysis tool 24 reviews outputs 96 to determine which events occurred. CDG engine 90 may receive outputs 96 and the output 26 of coverage analysis tool and may generate inputs 94 which may encourage system 92 to produce the coverage events listed in coverage model 12.

Test verification system 92 may be any type of system used in verification of devices under test 22. For example, test verification system 92 might be random test generator 10 and coverage model 12 might be a list of the desired commands which test generator 10 should have in each test or in the total set of tests.

Other examples of test verification systems 92 might be:
behavioral devices that generate stimuli to a device under test. These behavioral devices can be part of the simulator or a separate component in the system;
a simulator in which the DUT is implemented as a part thereof;
a hardware accelerator or an emulator simulates the device under test;
the random test generator and or coverage analysis tool are embedded in the simulator and/or simulation environment.

In this embodiment, CDG engine 90 may have an input generator 98, instead of directive converter 40. Input generator 98 may convert the output of Bayesian network 38 into the input for test verification system 92.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A coverage directed test generation (CDG) engine comprising:
a data analyzer which analyzes coverage data from a current test run of a test verification system and from previous test runs to determine which coverage events from a coverage model have occurred therein, at what frequency and which ones have not yet occurred;
a coverage model listing coverage events which define the goal of the test verification system;
a Bayesian network which determines input data to said test verification system to achieve at least some of said coverage events; and
a task manager coupled to said data analyzer and said Bayesian network which refers to said coverage model and queries said Bayesian network to produce input data to achieve desired coverage events.

2. A CDG engine according to claim 1 and wherein said test verification system is a random test generator and a simulator simulating a device under test.

3. A CDG engine according to claim 1 and wherein said test verification system is a behavioral device that generates stimuli to a device under test.

4. A CDG engine according to claim 1 and wherein said test verification system is a simulator which implements a device under test.

5. A CDG engine according to claim 1 and wherein said test verification system is a hardware accelerator or an emulator that simulates a device under test.

6. A CDG engine according to claim 1 and wherein said test verification system is a simulation environment having a random test generator and/or a coverage analysis tool embedded therein.

7. A computer product readable by a machine, tangibly embodying a program of instructions executable by the machine to perform method steps for coverage directed test verification, said method comprising:
analyzing coverage data from a current test run of a test verification system and from previous test runs to determine which coverage events from a coverage model have occurred therein, at what frequency and which ones have not yet occurred;
having a coverage model listing coverage events which define the goal of the test verification system;
having Bayesian network which determines input data to said test verification system to achieve at least some of said coverage events; and
querying said Bayesian network to produce input data to achieve desired coverage events.

8. The product according to claim 7 and wherein said test verification system is a random test generator and a simulator simulating a device under test.

9. The product according to claim 7 and wherein said test verification system is a behavioral device that generates stimuli to a device under test.

10. The product according to claim 7 and wherein said test verification system is a simulator which implements a device under test.

11. The product according to claim 7 and wherein said test verification system is a hardware accelerator or an emulator that simulates a device under test.

12. The product according to claim 7 and wherein said test verification system is a simulation environment having a random test generator and/or a coverage analysis tool embedded therein.

13. A method for coverage directed test verification comprising:

analyzing coverage data from a current test run of a test verification system and from previous test runs to determine which coverage events from a coverage model have occurred therein, at what frequency and which ones have not yet occurred;

having a coverage model listing coverage events which define the goal of the test verification system;

having Bayesian network which determines input data to said test verification system to achieve at least some of said coverage events; and querying said Bayesian network to produce input data to achieve desired coverage events.

* * * * *